United States Patent

Takayama et al.

[11] Patent Number: 5,844,347
[45] Date of Patent: Dec. 1, 1998

[54] SAW DEVICE AND ITS MANUFACTURING METHOD

[75] Inventors: Ryoichi Takayama, Hirakata; Keizaburo Kuramasu, Tsuzuki-gun; Toshio Sugawa, Katano, all of Japan

[73] Assignee: Matsushita Electric Industrial Co., Ltd., Osaka, Japan

[21] Appl. No.: 704,209

[22] Filed: Aug. 29, 1996

[30] Foreign Application Priority Data

Sep. 1, 1995 [JP] Japan ................................. 7-224855

[51] Int. Cl.⁶ .................................................. H03H 9/25
[52] U.S. Cl. ...................... 310/313 R; 310/363; 310/364
[58] Field of Search ........................... 310/313 A, 313 B, 310/313 D, 313 R, 363, 364

[56] References Cited

U.S. PATENT DOCUMENTS

| 4,445,066 | 4/1984 | Nishiyama et al. | 310/364 |
|---|---|---|---|
| 4,477,952 | 10/1984 | Cresenzi et al. | 310/364 |
| 5,325,012 | 6/1994 | Sato et al. | 310/364 |

FOREIGN PATENT DOCUMENTS

| 0 246 626 | 11/1987 | European Pat. Off. | H03H 3/08 |
|---|---|---|---|
| 2 711 863 | 5/1995 | France | H03H 9/25 |
| 71-22961 | 5/1995 | Japan | H03H 9/145 |

OTHER PUBLICATIONS

Yuhara, et al., Sputtered Al–Ti Electrodes for High Frequency and High Power SAW Devices, Jap. Journal of Appl. Phys., pp. 135–137, Dec. 9, 1986.

*Primary Examiner*—Thomas M. Dougherty
*Attorney, Agent, or Firm*—McDermott, Will & Emery

[57] ABSTRACT

A SAW device comprising an inter-digital electrode capable of withstanding application of excessive electric power, while preventing an increase of insertion loss. The SAW device has an inter-digital electrode formed by alternating layers of aluminum films and conductive films, where the conductive films have an elastic constant greater than that of the aluminum films.

4 Claims, 5 Drawing Sheets

... ...

SAW DEVICE AND ITS MANUFACTURING METHOD

BACKGROUND OF THE INVENTION

1. Field of the Invention

The present invention relates to a SAW device, and more particularly to an inter-digital transducer electrode of a SAW device.

2. Description of the Prior Art

Generally, a SAW device forms an inter-digital transducer electrode by disposing an electrode made of an aluminum film in a comb shape on the surface of a piezoelectric substrate, and composes a filter or resonator.

Recently, as the mobile communication becomes higher in frequency, the operating frequency of the SAW device is increased in frequency from hundreds MHz to several GHz, while a higher power output is demanded at the same time. As a result of the increase in frequency, the pattern width of the inter-digital transducer electrode is required to be finer. For example, in a filter having a center frequency of 1.5 GHz band, the electrode wire width must be formed in about 0.7 $\mu$m.

When a large electric power is applied to a SAW device having a fine electrode width, strain generated by surface acoustic wave causes stress on the electrode film. When this stress exceeds the limit stress of the electrode film, aluminum atoms in the electrode material move in the grain boundary. As a result, hillocks and voids are formed and the electrode is broken, and the characteristics of the SAW device deteriorate.

To solve such problems, as disclosed in Japanese Patent Publication 61-47010, it is proposed to use an aluminum alloy film containing copper as the electrode material. The aluminum alloy film withstands a larger electric power application as compared with the pure aluminum film. It is also attempted to reinforce the electrode film by adding titanium, nickel, palladium, etc.

Prior art devices, however, do not achieve enough electric power durability and low insertion loss for the electric power necessary for use in the transmission stage of mobile telephone. For example, an analog cellular telephone is required to withstand application of an electric power of 1 W or more, and to have an insertion loss as low as that of a common dielectric filter. As stated, in order to withstand a larger electric power application, the rate of additive metals can be increased. However, the additive metals result in an undesirable increase in the specific resistance of the alloy film and the insertion loss.

SUMMARY OF THE INVENTION

It is therefor a primary object of the invention to present an SAW device comprising an inter-digital transducer electrode capable of withstanding a large electric power application and preventing increase of insertion loss.

According to the invention, the inter-digital transducer electrode provided on the surface of a piezoelectric substrate is formed by the alternate lamination of an aluminum film and a film made of a conductive material having an elastic constant greater than the aluminum film. Further, the number of laminates of the film comprising the conductive material and the aluminum film is at least two layers or more.

This constitution presents a SAW device capable of suppressing generation of voids and hillocks due to the movement of aluminum atoms at the time of application of a large electric power, and preventing the increase of insertion loss.

DETAILED DESCRIPTION OF THE INVENTION

Figure 1A:
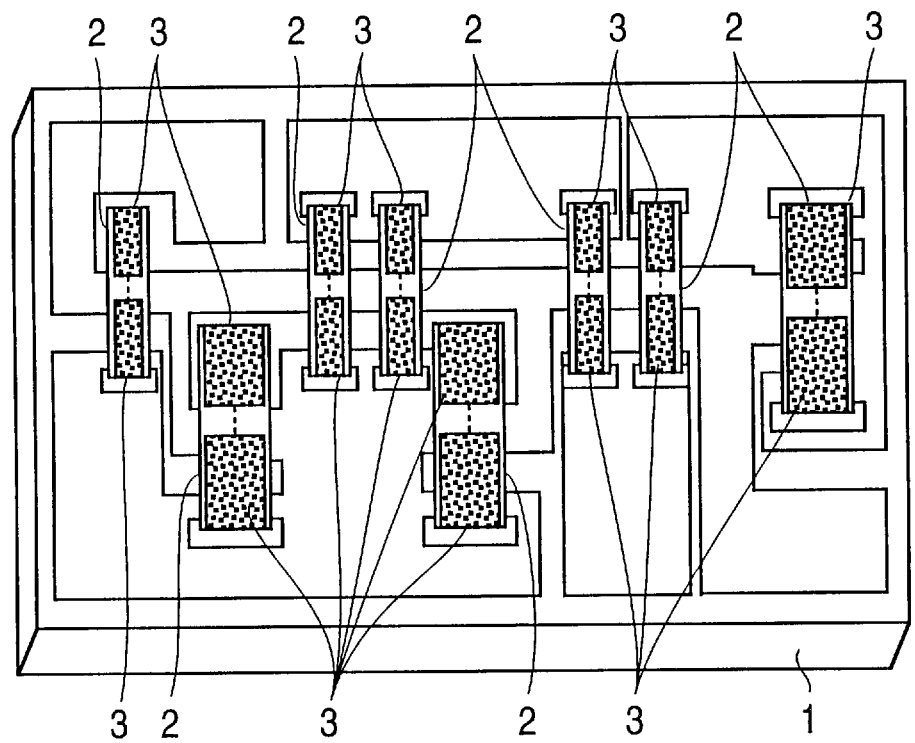
FIG. 1(a) is a perspective view showing a constitution of a SAW device fabricated according to the present invention.

Embodiments of the invention are described in detail below. According to the essential point of the invention, the inter-digital transducer electrode provided on the surface of a piezoelectric substrate is formed by the alternate lamination of an aluminum film and a film comprising a conductive material having an elastic constant greater than the aluminum film. Further, the number of laminates of the film comprising the conductive material and the aluminum film is at least two layers or more.

The thickness of each layer of aluminum film is approximately 150 nm or less. The thickness of each layer of the film comprising the conductive material having an elastic constant greater than the aluminum film is formed so as to be thinner than the thickness of the aluminum film. As a result, an increase in electric resistance of electrode is prevented, the mechanical strength of the electrode is increased, and it is enabled to withstand a larger electric power.

Moreover, the outermost layer of the laminated electrode of the invention is an aluminum film, and its film thickness is approximately 50 nm or less, or the outermost layer of the laminated electrode is a film comprising the conductive material having an elastic constant greater than the aluminum film. As a result, the structure is resistant to application of large electric power by preventing generation of hillocks and voids formed on the outermost layer.

When a surface acoustic wave element is excited, a strain is caused on a piezoelectric substrate, and this strain results in the application of a stress to the inter-digital transducer electrode. When the stress exceeds the limit stress of the film, aluminum atoms in the electrode propagate through the grain boundary and move to the surface to form hillocks. When aluminum atoms move into the surface, voids of aluminum atoms are formed in the film. As many hillocks and voids are formed, the electrode film is broken, and fluctuations of frequency and increase of insertion loss occur, and finally the SAW device is unable to function properly.

Such generation of hillocks and voids due to the movement of aluminum atoms is less likely to occur as the mechanical strength of the film increases, and is less likely to occur as the particle size forming the aluminum film is smaller, and it has been also known hitherto that the movement of aluminum atoms is suppressed when atoms of copper, titanium or the like precipitate into the grain boundary. Accordingly, attempts have been made to add various materials. However, the amount of addition was limited because the increase of concentration of additive materials causes an increase in the specific resistance of the film, thereby leading to significant increase of insertion loss.

As discovered by the present inventors, if the concentration of the additive materials is increased, in the case of a single alloy film, the grain boundary exists continuously from the interface of the piezoelectric substrate and electrode to the surface of the electrode, and the particle size is larger on the electrode surface. As a result, when stress applied to the electrode exceeds the limit stress of the alloy electrode, it is found that the aluminum atoms move up to the electrode surface through the grain boundary, thereby causing hillocks.

On the basis of such findings, the present invention operates to prevent magnification of particle size of aluminum film and to prevent aluminum atoms from moving up to the electrode surface through the grain boundary, by dividing the aluminum film in layers by a material having an elastic constant larger than that of the aluminum film.

Furthermore, by laminating a material having a larger elastic constant than the aluminum films between aluminum films, the elastic strength of the entire electrode film is enhanced, so that it is hardly affected by application of a large stress. Incidentally, if the thickness of each layer of the laminated aluminum film is thick, aluminum atoms move in the lateral direction due to the stress by excitation, and side hillocks are formed. The side hillocks lead to deterioration of the electrode, and can cause short failure when contacting with the adjacent inter-digital transducer electrode.

One method of preventing this is to reduce the thickness of the aluminum films to be laminated. Specifically, the inventors discovered through experiments that it is effective to define the thickness of the aluminum film at approximately 150 nm or less, preferably 100 nm or less, in order to withstand electric power application of 1 W or more for use in the transmitter. Further, since the conductive material having an elastic constant greater than the aluminum film is generally higher in density than the aluminum film, it is preferred to form the conductive film as thin as possible, and at least by forming the conductive film thinner than the aluminum film, increase of electric resistance of electrode can be prevented.

EXAMPLES

Specific examples are described below.

Example 1

Figure 1B:
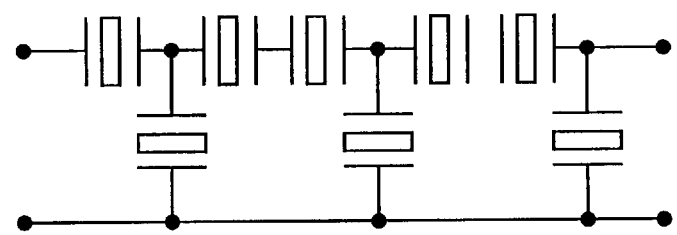
FIG. 1(b) is a filter structure of the same SAW device.

A SAW device in accordance with the present invention is described with reference to FIGS. 1(*a*), (*b*). FIG. 1(*a*) is a perspective view showing the composition of a ladder-type filter 872 MHz.

FIG. 1(*b*) is its filter structure of the same SAW device. Reference numeral 1 denotes a piezoelectric substrate, and lithium tantalate is used in the embodiment (called LT substrate hereinafter). Reference numeral 2 is an inter-digital transducer electrode, and 3 is a reflector electrode.

FIGS. 2(*a*) to (*c*) illustrate a first embodiment of the inter-digital transducer electrode of the present invention. More specifically, FIGS. 2(*a*)–(*c*) are sectional schematic views illustrating the laminate electrode, where the electrode comprises a variable number of laminates. The shown sectional views illustrate only one inter-digital transducer electrode. In the drawings, reference numerals 31 to 33, 35 to 38, and 40 to 45 are aluminum films, and 51 and 52, 53 to 55, and 56 to 60 are conductive material films having an elastic constant greater than the aluminum film. As shown in FIG. 2(*a*), the inter-digital transducer electrode 2 comprises films 31 to 33 and 51 and 52. The inter-digital transducer electrode 2 shown in FIG. 2(*b*) comprises films 35 to 38 and 53 to 55. The inter-digital transducer electrode 2 of FIG. 2(*c*) comprises films 40 to 45 and 56 to 60 in FIG. 2(*c*).

The inter-digital transducer electrode illustrated in FIGS. 2(*a*)–2(*c*) was formed by the following method. Specifically, the electrode film was formed by sputtering method, and the sputtering device was a carrousel type sputtering device (SPC-530H of Nichiden ANELVA). Targets of aluminum and titanium were attached to the sputtering device, and the LT substrate 1 was set in a substrate holder, and the degree of vacuum was adjusted to 5 mTorr, and the films were laminated at the substrate temperature of room temperature.

By way of comparison, the electrodes in the composition shown in FIGS. 3(*a*), (*b*) were also fabricated and evaluated. As shown in FIG. 3, reference numeral 1 is a piezoelectric substrate, 2 is an inter-digital transducer electrode, 46 is a film made of a single material, 47 is an aluminum film, and 61 is a conductive material film having an elastic constant greater than aluminum. In this embodiment, as single material film composition in FIG. 3(*a*), a pure aluminum film and an aluminum-1 wt. % titanium alloy film were prepared, and as a three-layer electrode film in FIG. 3(*b*), an aluminum/titanium/aluminum film composition was fabricated in the same apparatus. The thickness of the electrode film of the fabricated electrode is shown in Table 1. Since the center frequency of the SAW filter fluctuates depending on the mass load effect of the electrode, in this embodiment, the frequency fluctuations are prevented by adjusting the film thickness so that the mass can be equivalent to the mass of the electrode at the time of preparation of electrode by aluminum film.

In these samples of electrode films, specified patterns were formed by photolithography and dry etching techniques, and then by dicing, die-bonding to the substrate for package and wire bonding connection, a filter of 872 MHz was prepared.

In the prepared samples, 4 W was applied at the center frequency in the atmosphere of 100° C., and the power durability was tested. The life in power durability test was expressed by normalizing the time until deterioration of insertion loss by 0.5 dB from the initial value, with respect to the life in the aluminum film. The results are shown in Table 1.

TABLE 1

Electrode Composition and life evaluation SAW device in Example 1

Figure 3A:
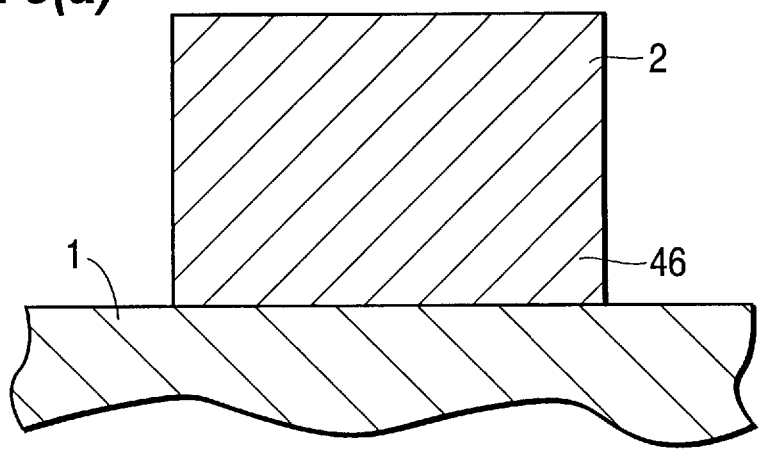
FIGS. 3a, 3b are sectional block diagrams of an electrode prepared for comparison.

| No. | Electrode composition (surface/ . . . /piezoelectric interface) | Film thickness of each layer (nm) | Sheet resistance | Life of SAW device | Electrode surface state after testing |
|---|---|---|---|---|---|
| FIG. 3(a) | Al only film | 420 | 1.0 | 1 | Hillocks formed |
| FIG. 3(a) | Al-1 wt. % Ti alloy film | 417 | 2.3 | ~$10^2$ | Hillocks formed |

TABLE 1-continued

Electrode Composition and life evaluation SAW device in Example 1

Figure 2A:
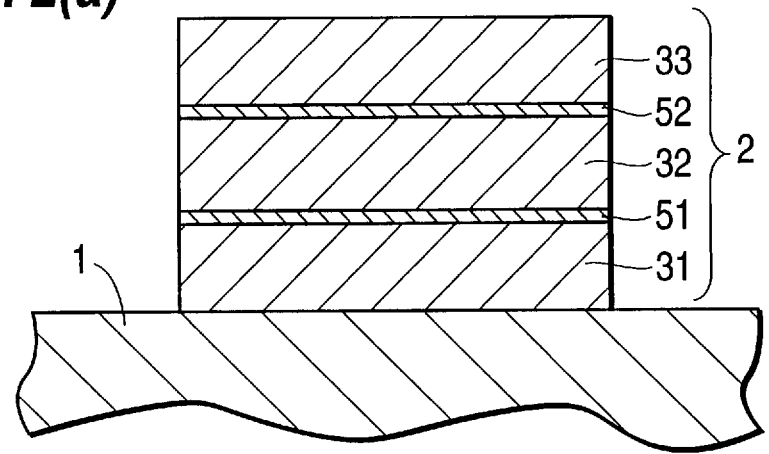
FIGS. 2a, 2b, 2c are sectional block diagrams showing a first embodiment of the invention.
Figure 2B:
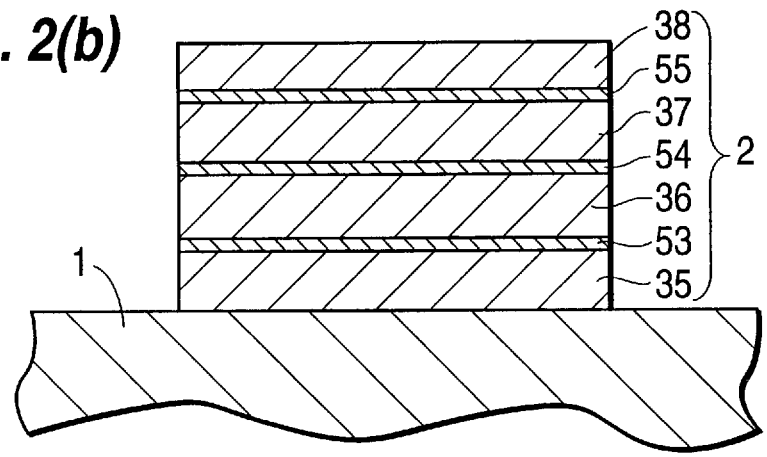
Figure 2C:
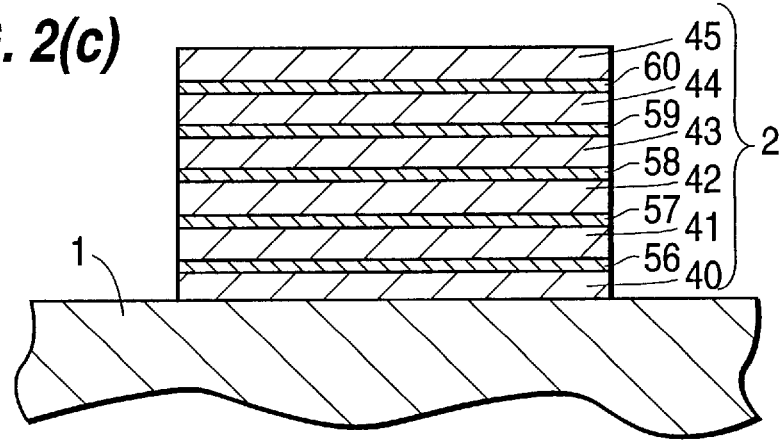
Figure 3B:
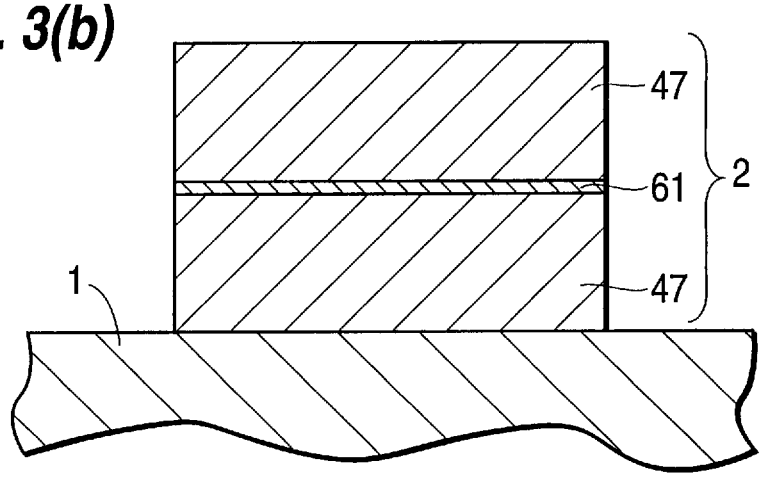

| No. | Electrode composition (surface/ . . . /piezoelectric interface) | Film thickness of each layer (nm) | Sheet resistance | Life of SAW device | Electrode surface state after testing |
|---|---|---|---|---|---|
| FIG. 3(b) | Al/Ti/Al 3-layer film | 195/15/200 | 1.1 | ~2 × 10$^3$ | Hillocks, side hillocks formed |
| FIG. 2(a) | Al/Ti/Al/Ti/Al 5-layer film | 120/15/125/15/125 | 1.6 | ~10$^5$ | Hillocks formed partly on surface |
| FIG. 2(b) | Al/Ti/Al/Ti/Al/Ti/Al 7-layer film | 75/15/90/15/90/15/90 | 1.6 | ~2.0 × 10$^7$ | Hillocks formed partly on surface |
| FIG. 2(c) | Al/Ti/Al/ . . . /Ti/Al 11-layer film | 45/15/50/15/50/ . . . /15/50 | 1.9 | 5 × 10$^7$ or more | No change |

As known from Table 1, in the case of three-layer composition in FIG. 3(b), hillocks were observed on the surface, and side hillocks on the side of the electrode, and the life of the SAW device was about 20 times that of the titanium added alloy film.

On the other hand, in the samples laminating two or more layers each of titanium film and aluminum film, with the film thickness of aluminum layer being 150 nm or less, as shown in FIG. 2(a), FIG. 2(b), and FIG. 2(c), the life of the SAW device was improved greatly, over 10$^7$ or more. In the samples of FIG. 2(a) and FIG. 2(b), however, hillocks were partly observed on the electrode surface. In contract, no change was noted in the sample of FIG. 2(c), and the life of the SAW device did not reach the end within the duration of the test.

It was therefore recognized that the laminate electrode composition of the present invention is very effective for improving the life of the SAW device. The sheet resistance of the electrode film affecting the insertion loss is normalized by defining the aluminum electrode film to be 1. Specifically, the sheet resistance is about 1.6 to 1.9 times in the laminate film electrode, which is a smaller value as compared with the alloy film adding 1 wt. % of titanium. As a result, the insertion loss was smaller than in the filter using the aluminum-1 wt. % titanium alloy film.

In this embodiment, the film thickness of titanium was fixed at 15 nm, but to obtain the effects of the invention, it has been experimentally confirmed that the film thickness of the titanium should be formed at least thinner than the thickness of the aluminum film. The thickness of each layer of the aluminum film is formed uniformly in the current embodiment. However, the present invention is not limited to such an embodiment. There is no problem if the thickness of each layer is different.

In this composition, the electrode is not limited to titanium alone, but same effects were confirmed by using copper, palladium, chromium, molybdenum, tungsten, tantalum, niobium, zirconium, hafnium, vanadium, nickel, and silver.

Example 2

In accordance with the first embodiment of the invention, an electrode of layer composition as shown in FIG. 2 was prepared in the same SAW filter composition shown in FIG. 1. By way of comparison, a pure aluminum film and an aluminum-1 wt. % copper alloy film were prepared as a single-layer electrode as shown in FIG. 3(a), and an aluminum/copper/ aluminum layer film was composed as a three-layer composition shown in FIG. 3(b).

The electrode composition of this embodiment is a laminate structure of aluminum film and copper film, and the electrode film thickness is shown in Table 2. In this embodiment, the film thickness was adjusted so as to be equivalent to the mass of the electrode when the electrode comprises an aluminum film, and frequency fluctuations were prevented.

In preparation of the second embodiment, a pattern of photo resist film in reverse pattern of electrode film was first formed on an LT substrate, and aluminum film and copper film were laminated in a specified thickness by electron beam vaporizing method on the substrate at degree of vacuum of 10$^{-4}$ Pa and substrate temperature of room temperature. Afterwards, by etching and removing the photo resist film, the electrode film formed on the photo resist layer was simultaneously removed, and a specified inter-digital transducer electrode was prepared.

After dicing the prepared sample, by die bonding to the substrate for package and wire bond connection, a filter of 872 MHz same as in Example 1 was prepared. The life of the SAW device was also evaluated in the same method as in Example 1. The results are summarized in Table 2.

TABLE 2

Electrode Composition and life evaluation SAW device in Example 2

| No. | Electrode composition (surface/ . . . /piezoelectric interface) | Film thickness of each layer (nm) | Sheet resistance | Life of SAW device | Electrode surface state after testing |
|---|---|---|---|---|---|
| FIG. 3(a) | Al only film | 420 | 1.0 | 1 | Hillocks formed |
| FIG. 3(a) | Al-1 wt. % Ti alloy film | 410 | 1.1 | ~10$^3$ | Hillocks formed |
| FIG. 3(b) | Al/Cu/Al 3-layer film | 170/15/200 | 1.1 | ~10$^4$ | Hillocks, side hillocks formed |

TABLE 2-continued

Electrode Composition and life evaluation SAW device in Example 2

| No. | Electrode composition (surface/ . . . /piezoelectric interface) | Film thickness of each layer (nm) | Sheet resistance | Life of SAW device | Electrode surface state after testing |
|---|---|---|---|---|---|
| FIG. 2(a) | Al/Cu/Al/Cu/Al 5-layer film | 100/15/110/15/110 | 1.3 | ~$10^5$ | Hillocks formed partly on surface |
| FIG. 2(b) | Al/Cu/Al/Cu/Al/Cu/Al 7-layer film | 66/15/75/15/75/15/75 | 1.3 | ~$5 \times 10^7$ | Hillocks formed partly on surface |
| FIG. 2(c) | Al/Cu/Al/ . . . /Cu/Al 11-layer film | 21/15/30/15/30/ . . . /15/30 | 1.7 | $5 \times 10^7$ or more | No change |

In the three-layer electrode in FIG. 3(b), the life of the SAW device was about 10 times that of the copper added film sample in FIG. 3(a), and in the samples in FIG. 2(a), FIG. 2(b), and FIG. 2(c) laminating two layers or more each of copper and aluminum, the life was $1 \times 10^6$ or more, and a notable improvement was observed as compared with the aluminum-1 wt. % copper alloy electrode in FIG. 3(a) or three-layer electrode in FIG. 3(b). In the samples in FIG. 2(a) and FIG. 2(b), hillocks were partly observed on the surface, however no change was detected in the sample in FIG. 2(c), and the life was longer than the test period. The sheet resistance of the electrode film was not significantly different from that of the aluminum-1 wt. % copper film in FIG. 3(a), and there was no practical problem.

Further, in the first embodiment, the film thickness of copper to be laminated was fixed at 15 nm. but to obtain the effects of the invention, this film thickness can be formed so as to be at least thinner than the thickness of the aluminum film. Moreover, the thickness of each layer is not required to be uniform. The thickness of the aluminum film is formed uniformly in the embodiment, but the present invention is not so limited, and there is no particular problem if the thickness of each layer is different.

In this composition, the electrode is not limited to copper alone. The same effects were confirmed by using titanium, palladium, chromium, molybdenum, tungsten, tantalum, niobium, zirconium, hafnium, vanadium, nickel, and silver.

Example 3

Figure 4:
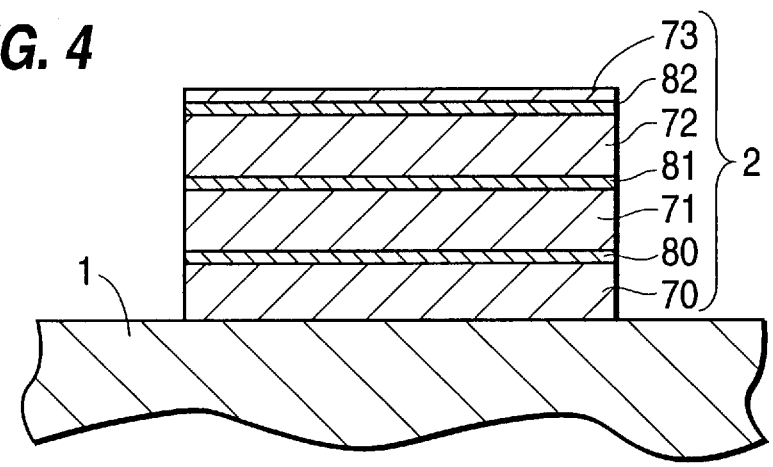
FIG. 4 is a sectional block diagram showing a third embodiment of the invention.

The third embodiment of the invention is illustrated in FIG. 4. In FIG. 4, reference numeral 1 is a piezoelectric substrate, 70 to 73 are aluminum films, and 80 to 82 are conductive material films, which are copper films in this embodiment. In this embodiment, aluminum films and copper films are laminated, and the film thickness of the aluminum film 73 at the outermost layer is 21 nm. The film thickness composition is shown in Table 3. By way of comparison, a sample of the same seven-layer composition with the film thickness of the outermost layer of 66 nm was prepared.

These samples of electrode composition were prepared in the same method as in Example 2. Test results are shown in Table 3.

TABLE 3

Electrode Composition and life evaluation SAW device in Example 2

| No. | Electrode composition (surface/ . . . /piezoelectric interface) | Film thickness of each layer (nm) | Sheet resistance | Life of SAW device | Electrode surface state after testing |
|---|---|---|---|---|---|
| FIG. 2(b) | Al/Cu/Al/Cu/Al/Cu/Al 7-layer film | 66/15/75/15/75/15/75 | 1.3 | ~$5 \times 10^7$ | Hillocks formed partly on surface |
| FIG. 4 | Al/Cu/Al/ . . . /Cu/Al 7-layer film | 21/15/90/15/90/15/90 | 1.3 | $5 \times 10^7$ or more | No change |

Referring to Table 3, by forming the outermost layer of the aluminum film thin, formation of hillocks on the surface can be prevented, and the life of the SAW device is extended as a result. Although the copper film is likely to oxide, the outermost layer is an aluminum film resistant to oxidation. There was no frequency fluctuation due to oxidation for a long period.

The electrode of this constitution is not limited to copper alone, but same effects were confirmed by using titanium, palladium, chromium, molybdenum, tungsten, tantalum, niobium, zirconium, hafnium, vanadium, nickel, and silver.

Example 4

Figure 5:
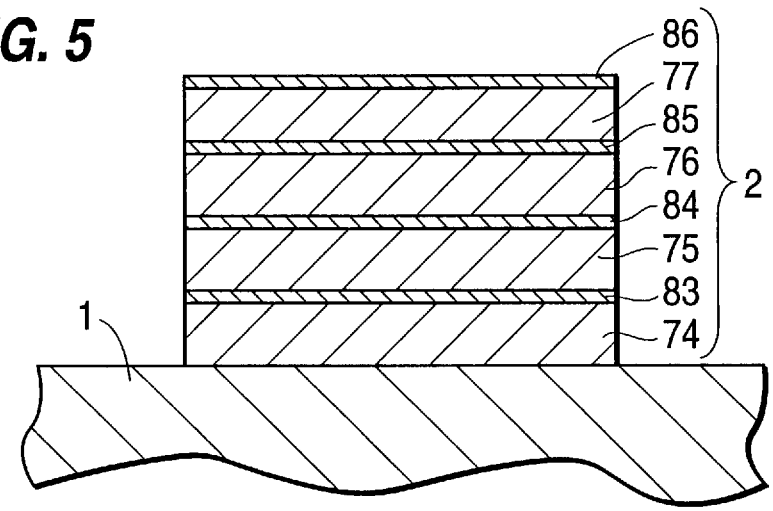
FIG. 5 is a sectional block diagram showing a fourth embodiment of the invention.

A fourth embodiment of the invention is illustrated in FIG. 5. In FIG. 5, reference numeral 1 is a piezoelectric substrate, 74 to 77 are aluminum films, and 83 to 86 are conductive material films, which are titanium films in this embodiment. In this embodiment, four layers of aluminum film and four layers of titanium film were laminated, and the outermost layer was a titanium film 86. By way of comparison, a seven-layer sample was prepared with an aluminum film of 75 nm at the outermost layer. Each film thickness is shown in Table 4. The method of preparation was same as the method of Example 1.

The life evaluation results of the SAW device are shown in Table 4.

TABLE 4

Electrode Composition and life evaluation SAW device in Example 2

| No. | Electrode composition (surface/ . . . /piezoelectric interface) | Film thickness of each layer (nm) | Sheet resistance | Life of SAW device | Electrode surface state after testing |
|---|---|---|---|---|---|
| FIG. 2(b) | Al/Ti/Al/Ti/Al/Ti/Al 7-layer film | 75/15/90/15/90/15/90 | 1.6 | ~2 × $10^7$ | Hillocks formed partly on surface |
| FIG. 5 | Al/ti/Al/ . . . /Ti/Al layer film | 15/80/15/80/15/80/15/80 | 1.6 | 5 × $10^7$ or more | No change |

In the sample in FIG. 2(b) of similar film thickness composition, hillocks were partly observed on the electrode surface after testing. In contrast, there was no change in the sample of the embodiment in FIG. 5, and the life of the SAW device was improved. The fourth embodiment is not limited to titanium alone, but the same effects are obtained by using other materials forming stable oxide film than titanium, including, but not limited to, chromium, niobium, zirconium, and hafnium.

Example 5

Figure 6:
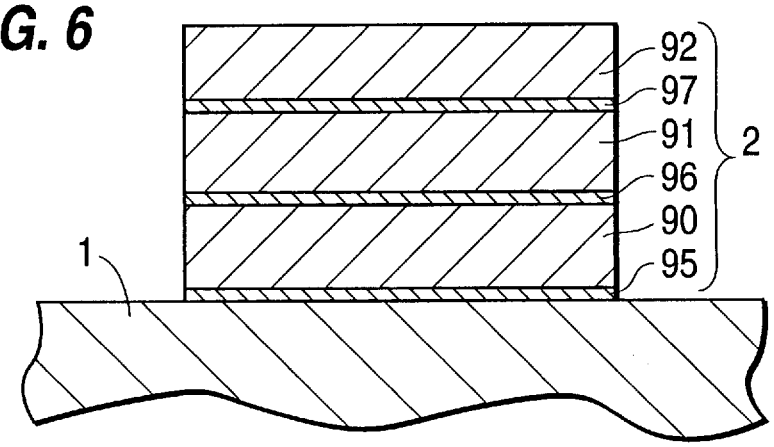
FIG. 6 is a sectional block diagram showing a fifth embodiment of the invention.

A fifth embodiment of the invention is described in FIG. 6. In this embodiment, a conductive material film 95 is a titanium film, and conductive material films 96 and 97 are titanium nitride films. Reference numerals 90, 91, and 92 are aluminum films, and they are combined to form an inter-digital transducer electrode 2. Reference numeral 1 is a piezoelectric substrate, which is an LT substrate in this embodiment.

The electrode film was prepared by vacuum deposition, and after evacuating to a degree of vacuum of $10^{-4}$ Pa, aluminum and titanium were evaporated by electron beam at substrate temperature of room temperature to form a film. At this time of film forming, the first layer contacting with the piezoelectric substrate 1 was the titanium film 95, and the layers 96 and 97 were titanium nitride films formed by feeding nitrogen gas to be $10^{-3}$ Pa at the time of evaporation. When forming the aluminum film, the feed of nitrogen gas was stopped, and the film was formed in high vacuum state.

In the electrode composition of the fifth embodiment, there was a titanium layer on the piezoelectric substrate 1, and the adhesion strength was improved as compared with the aluminum. The laminate with the aluminum was a titanium nitride film, and reaction with the aluminum film hardly occurred, and diffusion hardly occurred if heated in the process of etching or assembling, and hence it was more stable. Further, the life of the SAW device was 10' even after heating at 300° C., and the electric resistance of electrode was as small as about 1.6 times that of the aluminum film. In this experiment, the method of using titanium is explained, but same effects are obtained by the same method by using transition metals, such as, but not limited to, zirconium, hafnium, vanadium, niobium, tantalum, chromium, molybdenum, and tungsten.

Example 6

In the filter composition shown in FIG. 1, an electrode comprises five layers in total including three layers of aluminum film and two layers of titanium borate film, in a laminate composition of aluminum film and titanium borate film. The film was formed by sputtering, and the apparatus was a carrousel type sputtering device (SPC-530H of Nichiden ANELVA). Targets of aluminum and titanium borate were attached to this sputtering device, and the LT substrate 1 was set in a substrate holder, and the degree of vacuum was adjusted to 5 mTorr, and the films were laminated at the substrate temperature of room temperature. The thickness of one layer of titanium borate film was 10 nm.

After forming the laminate electrode, a specified pattern was formed by photolithography by etching the electrode film by ion milling. The subsequent process is the same method as in Example 1. The test method was also the same as in Example 1. In this embodiment, slight hillocks were noted on the electrode surface after testing, but the life of the SAW device was 5×$10^7$ or more. This is the effect of the larger mechanical strength of titanium borate film and small particle size of the aluminum film formed on the titanium borate film.

In the composition of the current embodiment, titanium, copper, and two titanium compound materials of titanium borate and titanium nitride are used, and the effects of the invention are obtained by laminating a material having an elastic constant greater than the aluminum film between aluminum film layers, and same effects are obtained by using palladium, chromium, molybdenum, tungsten, tantalum, niobium, zirconium, hafnium, vanadium, nickel, silver, other single metal, titanium carbide, nickel chromium, titanium nitride, other carbides, nitrides, and alloys.

The layers of material having an elastic constant greater than the aluminum film are not necessarily formed of the same material. The same effects are obtained so long as the films laminated between aluminum films are made of materials having an elastic constant greater than the aluminum films.

This embodiment relates to the LT substrate, but the invention is not limited to the LT substrate alone, but same effects are obtained by forming, for example, on lithium niobate substrate, lithium tetraborate substrate, or single crystal substrate such as quartz substrate. Also the same effects are obtained in a piezoelectric substrate using zinc oxide film formed on a sapphire substrate.

In summary, the invention comprises an inter-digital transducer electrode capable of withstanding the application of a large electric power and keeping the sheet resistance low, by laminating aluminum films and films of conductive material having an elastic constant greater than the aluminum films. As a result, the present invention produces outstanding results in high reliability production of transmitter filter for mobile telephones, oscillators used in keyless entry system and other such devices that require application of a large electric power.

Of course, the present invention may be embodied in other specific forms without departing from the spirit or essential characteristics thereof. The present embodiments are therefore to be considered in all respects as illustrative and not restrictive, the scope of the invention being indicated by the appended claims rather than the foregoing description, and all changes which come within the meaning and range of equivalency of the claims are therefore intended to be embraced therein.

What is claimed is:

1. A SAW device comprising a piezoelectric substrate and inter-digital transducer electrode provided on a surface of said piezoelectric substrate, said inter-digital transducer electrode comprising a first material layer and a second material layer, said first material comprising alone aluminum, said second material comprising only one conductive material which has an elastic constant greater than the elastic constant of said first material, and said inter-digital transducer electrode comprising repetitive layers of said first material layer and said second material layer, wherein each of said films of said first material has a thickness of approximately 150 nm or less, and each of said films of said second material has a thickness less than the thickness of said films of said first material.

2. A SAW device according to claim 1, wherein said inter-digital electrode comprises an outermost layer formed by one of said films of the first material, said outermost layer having a thickness of approximately 50 nm or less.

3. A SAW device according to claim 1, wherein said inter-digital electrode comprises an outermost layer formed by one of said films of the second material.

4. A SAW device according to claim 1, further comprising a transition metal layer positioned between said piezoelectric substrate and said inter-digital electrode, said transition metal layer comprising a conductive material.

* * * * *